US 9,760,016 B2

(12) United States Patent
Tanaka

(10) Patent No.: US 9,760,016 B2
(45) Date of Patent: Sep. 12, 2017

(54) LITHOGRAPHY APPARATUS, LITHOGRAPHY SYSTEM, AND METHOD OF MANUFACTURING ARTICLE

(71) Applicant: CANON KABUSHIKI KAISHA, Tokyo (JP)

(72) Inventor: Ryo Tanaka, Sakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 14/608,774

(22) Filed: Jan. 29, 2015

(65) Prior Publication Data

US 2015/0220002 A1 Aug. 6, 2015

(30) Foreign Application Priority Data

Feb. 3, 2014 (JP) ................................. 2014-018832

(51) Int. Cl.
*G03F 7/20* (2006.01)
*G03F 9/00* (2006.01)

(52) U.S. Cl.
CPC ...... *G03F 7/70491* (2013.01); *G03F 7/70191* (2013.01); *G03F 7/70991* (2013.01); *G03F 9/7019* (2013.01)

(58) Field of Classification Search
CPC ............. G03F 7/70491; G03F 7/70991; G03F 7/70725; G03F 7/7075; G03F 7/70633; G03F 9/7019; G03F 9/7003
See application file for complete search history.

(56) References Cited

U.S. PATENT DOCUMENTS 6,043,864 A * 3/2000 Lo .................. G03F 7/70541
355/53
7,083,338 B2 8/2006 Shin et al.
(Continued)

FOREIGN PATENT DOCUMENTS

CN 1637613 A 7/2005
CN 101276143 A 10/2008
(Continued)

OTHER PUBLICATIONS

Office Action issued in Chinese Patent Application No. CN201510056652.1, mailed Sep. 26, 2016. English translation provided.

*Primary Examiner* — Michelle M Iacoletti
(74) *Attorney, Agent, or Firm* — Rossi, Kimms & McDowell LLP

(57) ABSTRACT

The present invention provides a lithography apparatus which performs a process of forming a pattern on a substrate conveyed from a coating apparatus which coats the substrate with a resist, the lithography apparatus including an obtaining unit configured to obtain, from the coating apparatus, first specifying information which specifies a processing target substrate conveyed from the coating apparatus to the lithography apparatus, out of a plurality of substrates which are coated with the resist by the coating apparatus and on which the process is to be performed, and a processing unit configured to select offset correction information corresponding to the processing target substrate from a plurality of pieces of offset correction information respectively corresponding to the plurality of substrates based on the first specifying information and perform the process on the processing target substrate by using the selected offset correction information.

17 Claims, 5 Drawing Sheets

(56) References Cited

U.S. PATENT DOCUMENTS

| | | | |
|---|---|---|---|
| 7,516,096 B1 * | 4/2009 | Hsu | G06Q 40/06 |
| | | | 705/36 R |
| 8,968,985 B2 | 3/2015 | Limb et al. | |
| 2004/0126004 A1 | 7/2004 | Kikuchi | |

FOREIGN PATENT DOCUMENTS

| JP | 4419233 B2 | 2/2010 |
|---|---|---|
| JP | 4905617 B2 | 3/2012 |

* cited by examiner

LITHOGRAPHY APPARATUS, LITHOGRAPHY SYSTEM, AND METHOD OF MANUFACTURING ARTICLE

BACKGROUND OF THE INVENTION

Field of the Invention

The present invention relates to a lithography apparatus, a lithography system, and a method of manufacturing an article.

Description of the Related Art

In a lithography process as a manufacturing process for a semiconductor device, liquid crystal device, or the like, an exposure apparatus is used, which transfers, via a projection optical system, a reticle (mask) pattern onto a substrate (a wafer or glass plate whose surface is coated with a resist). A lithography process for a semiconductor device has, as a pre-process for an exposure process by an exposure apparatus, a coating process of coating the surface of a substrate with a resist (photoresist), and has, as a post-process, a developing process of developing the substrate onto which a pattern has been transferred. As an apparatus which performs a coating process and a developing process, there is available a coating/developing apparatus called a coater/developer having a coating function (spin coater) of uniformly coating the surface of a substrate with a resist while rotating it at high speed and a developing function.

A substrate conveying mechanism arranged between adjacent apparatuses automatically conveys a substrate between an exposure apparatus and a coating/developing apparatus in order to avoid the cumbersome operation of loading a lot processed in each process and improve throughput while maintaining the chemical properties of a resist. In addition, a scheme of connecting the exposure apparatus to the coating/developing apparatus is called inline connection and is adopted in many lithography systems.

In a lithography process for a semiconductor device, a resist pattern is formed, which serves as a mask when performing etching or impurity implantation. In this case, exposure is performed to overlay a reticle pattern on an underlying pattern while an exposure position is corrected based on the positions of alignment marks formed on a substrate (that is, while performing an alignment process).

In order to improve overlay accuracy, an alignment process may be performed with respect to all the shot regions on a substrate. To apply this technique to a manufacturing process for a semiconductor device, it is necessary to also satisfy the requirement of throughput. Under the circumstance, Japanese Patent Nos. 4419233 and 4905617 have proposed a technique of reducing the number of times of alignment detection on the second and subsequent layers by using initial distortion data representing the formation position distortion of a pattern on the first layer for alignment in pattern exposure on the second and subsequent layers.

In order to further improve the overlay accuracy and the throughput, it is conceivable to manage a correction value (offset) which changes for each substrate in a single lot and reflect each correction value.

When, however, improving overlay accuracy by reflecting an offset on a substrate basis, the offset may not be properly reflected for each substrate, and the overlay accuracy may not be properly maintained. This is because, for example, in a coating/developing apparatus, when a substrate loss occurs and a defect (omission) of a substrate of a lot occurs, inconsistency (substrate shift) occurs in the relationship between an offset on a substrate basis and a processing target substrate. In this case, the overlay accuracy deteriorates on substrates of such a lot, resulting in the necessity of rework.

SUMMARY OF THE INVENTION

The present invention provides a technique advantageous in reflecting, on a processing target substrate of a plurality of substrates of a lot, corresponding offset correction information.

According to one aspect of the present invention, there is provided a lithography apparatus which performs a process of forming a pattern on a substrate conveyed from a coating apparatus which coats the substrate with a resist, the lithography apparatus including an obtaining unit configured to obtain, from the coating apparatus, first specifying information which specifies a processing target substrate conveyed from the coating apparatus to the lithography apparatus, out of a plurality of substrates which are coated with the resist by the coating apparatus and on which the process is to be performed, and a processing unit configured to select offset correction information corresponding to the processing target substrate from a plurality of pieces of offset correction information respectively corresponding to the plurality of substrates based on the first specifying information and perform the process on the processing target substrate by using the selected offset correction information.

Further aspects of the present invention will become apparent from the following description of exemplary embodiments with reference to the attached drawings.

DESCRIPTION OF THE EMBODIMENTS

Figure 1:
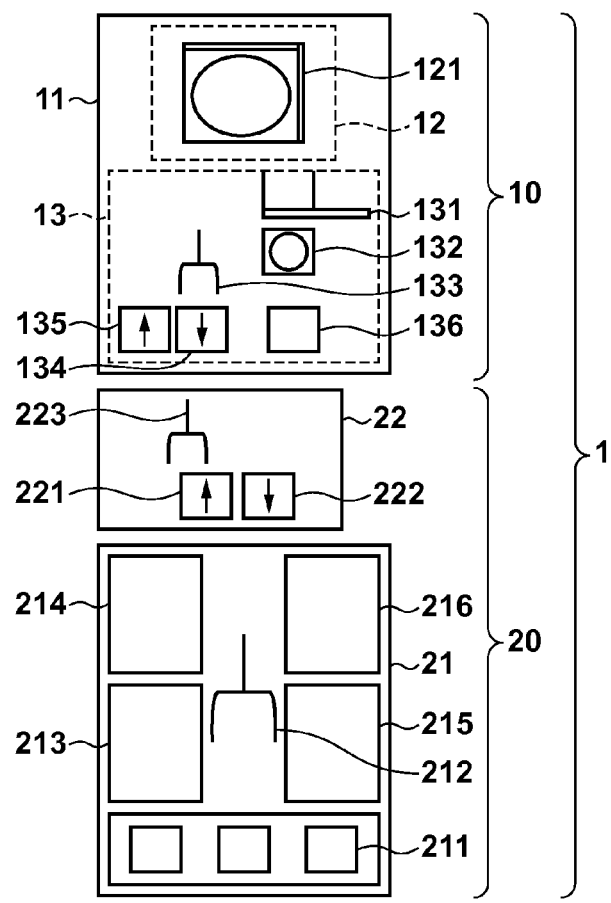
FIG. 1 is a schematic view showing the arrangement of a lithography system as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a lithography system 1 as one aspect of the present invention. The lithography system 1 is a system which includes an exposure apparatus 10 and a coating/developing apparatus 20 and is used in a lithography process as a manufacturing process for a semiconductor device, liquid crystal device, or the like. In addition, the lithography system 1 includes a host computer which is connected to the exposure apparatus 10 and the coating/developing apparatus 20 via a network and controls the exposure apparatus 10 and the coating/developing apparatus 20.

The exposure apparatus 10 is a lithography apparatus which forms a pattern on a substrate. In this embodiment, this apparatus exposes a substrate conveyed from the coating/developing apparatus 20 by using a step-and-repeat scheme or step-and-scan scheme. As shown in FIG. 1, the exposure apparatus 10 is accommodated in a chamber 11 and includes an exposure main body unit 12 and a substrate conveying unit 13.

Figure 2:
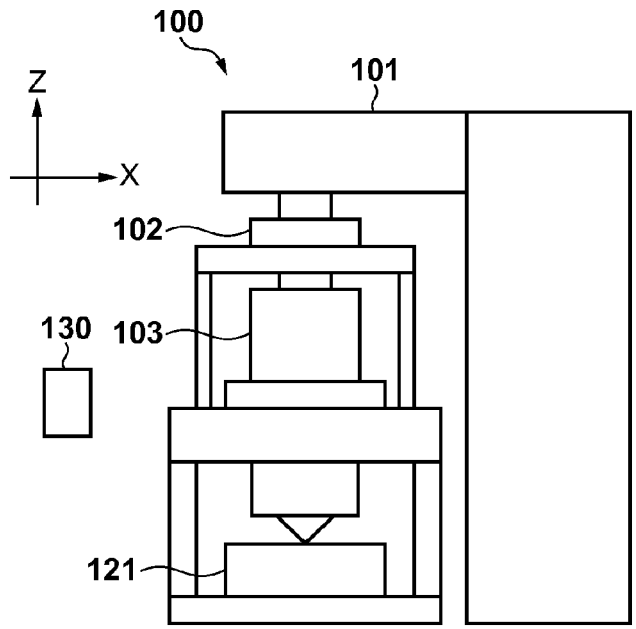
FIG. 2 is a schematic view showing the arrangement of the exposure processing unit of an exposure apparatus shown in FIG. 1.

As shown in FIG. 2, the exposure main body unit 12 includes an exposure processing unit 100 which transfers a reticle pattern onto a substrate. FIG. 2 is a schematic view showing the arrangement of the exposure processing unit 100. The exposure processing unit 100 includes an illumination optical system 101, a reticle stage 102 which holds a reticle, a projection optical system 103, a substrate stage 121 which holds a substrate, and a control unit 130.

The illumination optical system 101 is an optical system including a lens, mirror, optical integrator, and stop, and illuminates, with light from a light source, a reticle on which a pattern is formed. As a light source, for example, it is possible to use an ArF excimer laser with a wavelength of about 193 nm, $F_2$ laser with a wavelength of about 153 nm, YAG laser, mercury lamp, or xenon lamp. When a laser is used as a light source, the illumination optical system 101 may include a shaping optical system which shapes parallel light from the light source into a predetermined shape or an incoherent optical system which converts coherent light into incoherent light.

The projection optical system 103 is an optical system which projects an image of a reticle pattern (that is, a pattern to be formed on a substrate) onto a substrate. As the projection optical system 103, it is possible to use an optical system constituted by only a plurality of lenses, an optical system including a plurality of lenses and at least one concave mirror, an optical system including a plurality of lenses and at least one diffraction optical element, or an optical system constituted by only a plurality of mirrors.

The reticle stage 102 and the substrate stage 121 are configured to be movable by, for example, a linear motor. When the exposure apparatus 10 uses the step-and-scan scheme, the reticle stage 102 and the substrate stage 121 synchronously move. In order to align a reticle (its pattern) with a substrate, at least one of the reticle stage 102 and the substrate stage 121 includes an actuator.

The control unit 130 controls the whole (operation) of the exposure apparatus 10 including a CPU, memory, and communication port. For example, the control unit 130 functions as an obtaining unit which obtains various types of information transmitted from the host computer and the coating/developing apparatus 20 via the communication port.

Referring back to FIG. 1, the substrate stage 121 is configured to be movable in the two-dimensional directions (the X-axis direction and the Y-axis direction) on a platen held by an antivibration pad. A reticle pattern is formed on the substrate held by the substrate stage 121.

The substrate conveying unit 13 includes a conveying hand 131 which conveys a substrate between the exposure main body unit 12 and the substrate conveying unit 13 and a conveying hand 133 which conveys the substrate inside the substrate conveying unit 13. The conveying hand 133 is formed from a horizontal articulated robot (SCARA robot), and loads and unloads a substrate.

In addition, the substrate conveying unit 13 includes a pre-alignment unit 132 which performs processes (pre-alignment and the like) while holding a substrate and a carrier port 136. When using an open cassette capable of accommodating a plurality of substrates (directly loading a substrate into the exposure apparatus 10) instead of inline-connecting the exposure apparatus 10 to the coating/developing apparatus 20, the carrier port 136 serves as a base on which the open cassette is placed. Note however that the carrier port 136 may be a base on which a FOUP (Front Opening Unified Pod), which is a sealed carrier, is placed, instead of an open cassette. After a PGV (Person Guided Vehicle) conveys the open cassette or FOUP, it may automatically perform loading and unloading. Alternatively, the open cassette or FOUP may be placed onto the carrier port 136 from above in the clean room by using an OHT (Over Head Transfer) mechanism.

In addition, the substrate conveying unit 13 includes a loading unit 134 and an unloading unit 135 which exchange (load and unload) a substrate between the exposure apparatus 10 and the coating/developing apparatus 20. The loading unit 134 for loading (conveying) a substrate (unexposed substrate) coated with a resist from the coating/developing apparatus 20 into the exposure apparatus 10 may have the function of a processing unit which performs processes (temperature adjustment, pre-alignment, and the like). Likewise, the unloading unit 135 which unloads (conveys) an exposed substrate (substrate having undergone exposure) from the exposure apparatus 10 into the coating/developing apparatus 20 may have the function of a processing unit which performs processes such as peripheral exposure.

The coating/developing apparatus 20 has the function of a coating apparatus which coats a substrate with a resist and the function of a developing apparatus which develops an exposed substrate. In this embodiment, the coating/developing apparatus 20 includes a coating/developing process unit 21 and a substrate conveying unit 22. The coating/developing process unit 21 and the substrate conveying unit 22 are respectively accommodated in independent chambers.

The coating/developing process unit 21 is constituted by a carrier port 211, on which the open cassette or FOUP is placed, and a horizontal articulated robot (SCARA robot), and includes a conveying hand 212 which conveys a substrate from the carrier port 211. The coating/developing process unit 21 also includes a resist coating unit 213, a heating unit 214, a developing unit 215, and a cooling unit 216.

The resist coating unit 213 has a function of coating (supplying) a substrate with a resist. The resist coating unit 213 is formed from a spin coater which uniformly coats (forms a resist film) a substrate with a resist by dropping the resist onto the substrate while rotating it.

The heating unit 214 performs a bake process by using a resistance heating scheme or infrared heating scheme. More specifically, the heating unit 214 performs a PB (PreBake) process and PEB (Post Exposure Bake) process on an unexposed substrate. A PB process is a heat treatment to be performed to evaporate a residual solvent contained in a resist or enhance the adhesiveness between the resist and a substrate after the substrate is coated with the resist. Since a PB process is performed before exposure (on an unexposed substrate), it is necessary to perform this process at a temperature at which neither polymerization nor thermal decomposition of additives contained in a resist occurs. In addition, a PEB process is a heat treatment to be performed after exposure and before a developing process to reduce the deformation of a resist pattern caused by a standing wave effect when exposure is performed by using light with a single wavelength. In addition, a PEB process is performed to accelerate a catalytic reaction after exposure on a chemically-amplified resist.

The developing unit 215 develops the substrate exposed by the exposure apparatus 10. The developing unit 215 can use an arbitrary scheme such as a spin scheme or spray scheme as a developing scheme.

The cooling unit 216 includes, for example, a cooled flat plate called a cooling plate, and cools the substrate held by the cooling plate. The cooling plate is cooled by, for example, the circulation of cooling water. Alternatively, the cooling plate may be cooled by electronic cooling based on the Peltier effect.

The substrate conveying unit 22 includes a loading unit 221 and an unloading unit 222 which exchange a substrate (unexposed substrate) having undergone pre-processes (resist coating, PB process, cooling, and the like) or the substrate exposed by the exposure apparatus 10 between the conveying hand 212 and a conveying hand 223.

The conveying hand 223 conveys the substrate, placed on the loading unit 221 by the conveying hand 212, to the loading unit 134 on the exposure apparatus side. The conveying hand 223 also conveys the substrate placed on the unloading unit 135 on the exposure apparatus side to the unloading unit 222.

A substrate conveying operation in the lithography system 1 will be described. Assume that in this embodiment, substrates to be processed by the exposure apparatus 10 are accommodated in the open cassette in units of 25 substrates (that is, 1 lot), and are placed on the carrier port 211 of the coating/developing apparatus 20.

The conveying hand 212 loads (conveys) a substrate accommodated in the open cassette into the resist coating unit 213. The resist coating unit 213 coats the substrate loaded by the conveying hand 212 with a resist.

The conveying hand 212 unloads the substrate coated with the resist from the resist coating unit 213, and loads the substrate into the heating unit 214. The heating unit 214 performs a PB process on the substrate loaded by the conveying hand 212.

The conveying hand 212 unloads the substrate having undergone the PB process from the heating unit 214 and loads the substrate into the cooling unit 216. The cooling unit 216 performs a cooling process on the substrate loaded by the conveying hand 212. The temperature of the substrate loaded into the exposure apparatus 10 is adjusted to, as a target temperature, a temperature that does not influence the interior of the chamber 11 accommodating the exposure apparatus 10, that is, the temperature inside the exposure main body unit 12 (an environmental temperature at the time of an exposure process). Note however that in the lithography system 1, the loading unit 134 (substrate conveying unit 13) on the exposure apparatus side has a function of adjusting the temperature of a substrate and has performed the final fine temperature adjustment for the substrate. Therefore, the cooling unit 216 is only required to perform temperature adjustment (cooling process) until the temperature of the substrate approaches the target temperature to some extent, and need not perform temperature adjustment until the temperature of the substrate reaches the target temperature (that is, the temperature of the substrate may be higher than the target temperature).

In order to load the substrate having undergone the temperature adjustment (cooling process) by the cooling unit 216 into the exposure apparatus 10, the conveying hand 212 unloads the substrate from the cooling unit 216 and conveys (places) the substrate onto the loading unit 221 on the coating/developing apparatus side. The conveying hand 212 conveys each of the 25 substrates accommodated in the open cassette in the above manner.

The conveying hand 223 conveys (places) the substrate, conveyed by the loading unit 221 on the coating/developing apparatus side, to the loading unit 134 on the exposure apparatus side. The temperature of the substrate placed on the loading unit 134 is adjusted to a temperature equal to the temperature inside the exposure main body unit 12.

The conveying hand 133 unloads the substrate, which has undergone the temperature adjustment by the loading unit 134, from the loading unit 134, and loads (places) the substrate onto the pre-alignment unit 132. The pre-alignment unit 132 detects the edges of the substrate by a CCD sensor while rotating the substrate, and obtains the notch, center, and eccentric amount of the substrate. Pre-alignment is then performed to align the directions of the notches of the substrates with a predetermined direction.

The conveying hand 131 unloads the substrate, which has undergone the pre-alignment, from the pre-alignment unit 132, and loads the substrate into the exposure processing unit 100. The substrate stage 121 holds the substrate. The exposure processing unit 100 performs an exposure process on the substrate held by the substrate stage 121.

The conveying hand 133 unloads the substrate, which has undergone the exposure process, from the substrate stage 121, and loads (places) the substrate onto the unloading unit 135 on the exposure apparatus side.

The conveying hand 223 unloads the substrate (exposed substrate), placed on the unloading unit 135 on the exposure apparatus side, from the unloading unit 135, and loads (places) the substrate onto the unloading unit 222 on the coating/developing apparatus side.

The conveying hand 212 unloads the substrate, placed on the unloading unit 222 on the coating/developing apparatus side, from the unloading unit 222, and loads the substrate into the heating unit 214. The heating unit 214 performs a PEB process on the substrate loaded by the conveying hand 212.

The conveying hand 212 unloads the substrate, which has undergone the PEB process, from the heating unit 214, and loads the substrate into the developing unit 215. The developing unit 215 performs a developing process on the substrate loaded by the conveying hand 212.

The conveying hand 212 unloads the substrate, which has undergone the developing processing, from the developing unit 215, and loads (accommodates) the substrate in a predetermined slot of the open cassette placed on the carrier port 211.

The lithography system 1 sequentially performs the above series of processes with respect to all the substrates (25 substrates in this embodiment) accommodated in the open cassette.

Figure 3:
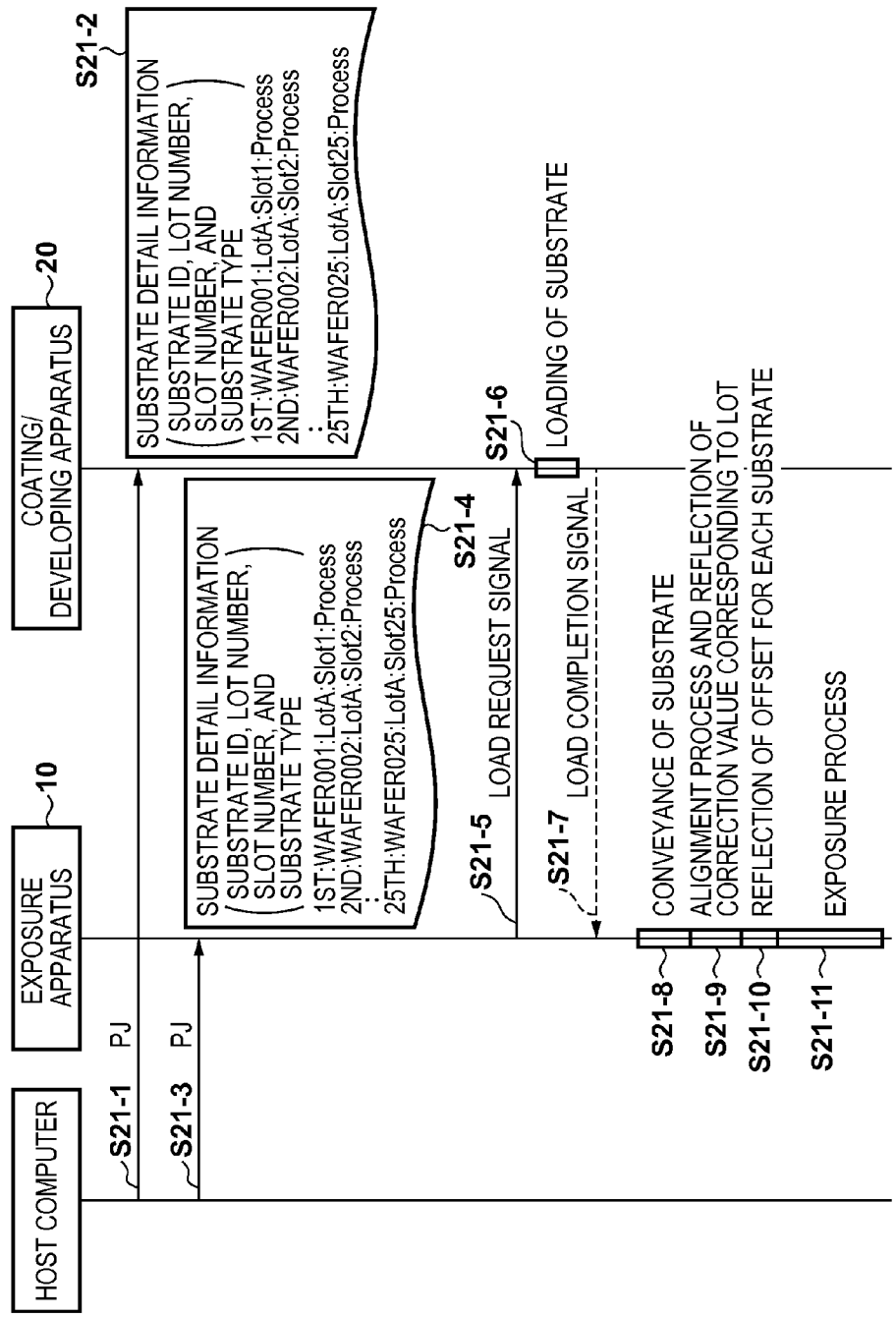
FIG. 3 is a sequence timing chart between an exposure apparatus, a coating/developing apparatus, and a host computer according to the related art.

The operation of the lithography system 1 according to the related art will be described below with reference to FIG. 3. FIG. 3 is a sequence timing chart between the exposure apparatus 10, the coating/developing apparatus 20, and the host computer.

In step S21-1, the host computer transmits a process job PJ to the coating/developing apparatus 20. In step S21-2, the coating/developing apparatus 20 receives the process job PJ transmitted from the host computer. The process job PJ instructs to perform a process of forming a pattern on a substrate, and includes substrate detail information representing the details of a plurality of substrates to be subjected to this process. Substrate detail information contains, for example, substrate identifiers for identifying substrates, a lot number indicating the lot to which each substrate belongs, slot numbers indicating the slots in which the respective substrates are accommodated, and a substrate type indicating the type of each substrate. Upon receiving the process job PJ from the host computer, the coating/developing apparatus 20 starts a process of coating a substrate with resist.

In step S21-3, the host computer transmits the process job PJ to the exposure apparatus 10. The process job PJ transmitted in step S21-3 is identical to the process job PJ transmitted in step S21-1. In step S21-4, upon receiving the process job PJ from the host computer, the exposure apparatus 10 starts an exposure process of exposing the substrate conveyed from the coating/developing apparatus 20.

In step S21-5, the exposure apparatus 10 transmits, to the coating/developing apparatus 20, a load request signal for requesting loading of the substrate. In step S21-6, the coating/developing apparatus 20 starts loading the substrate coated with the resist into the exposure apparatus 10. In step S21-7, the coating/developing apparatus 20 transmits, to the exposure apparatus 10, a load completion signal to notify the completion of the loading of the substrate into the exposure apparatus 10.

In step S21-8, the exposure apparatus 10 conveys the substrate loaded from the coating/developing apparatus 20 and loads the substrate into the exposure processing unit 100 (makes the substrate stage 121 hold the substrate). In step S21-9, the exposure apparatus 10 performs an alignment process on the substrate held by the substrate stage 121 and reflects a correction value corresponding to the lot (that is, on a lot basis). In step S21-10, the exposure apparatus 10 reflects, for example, an offset (offset correction information) for each substrate (that is, on a substrate basis) obtained in advance from the initial lot. In step S21-11, the exposure apparatus 10 performs an exposure process on the substrate while reflecting a correction value corresponding to the lot and an offset for each substrate.

Figure 4:
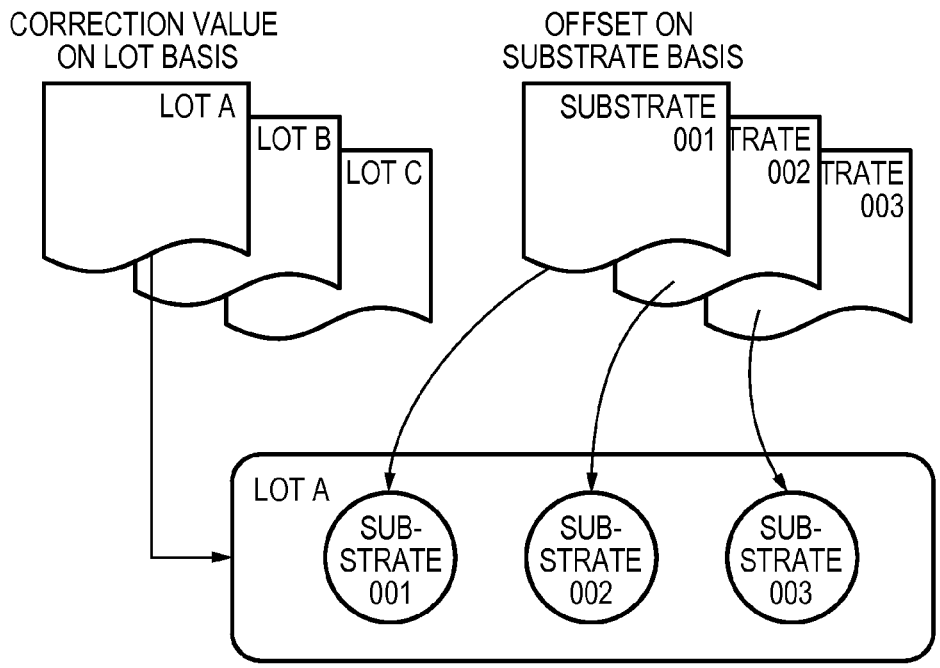
FIG. 4 is a view conceptually showing the reflection of a correction value corresponding to a lot and an offset on a substrate basis in the exposure apparatus.
Figure 5:
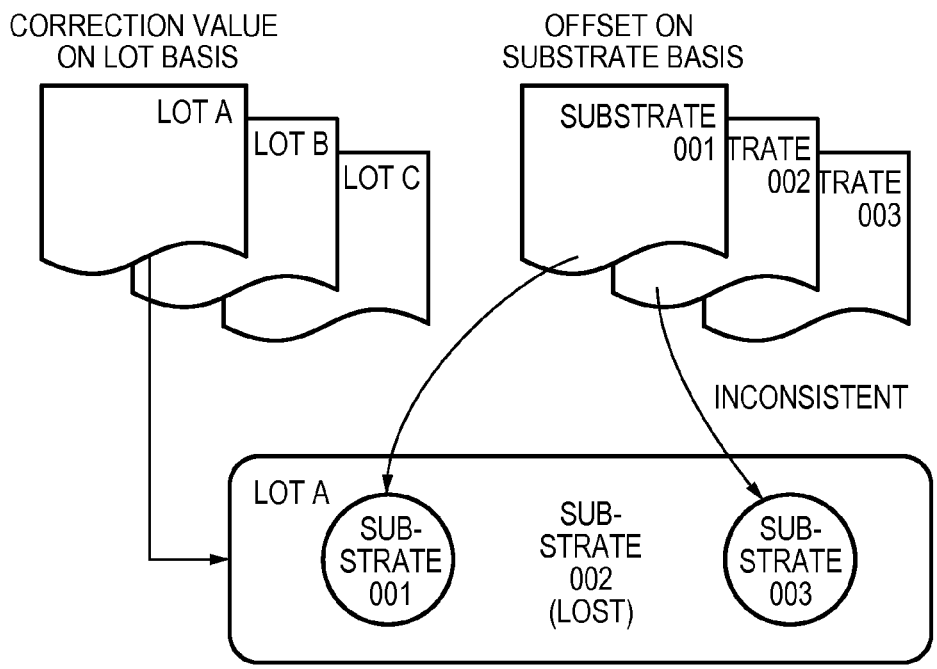
FIG. 5 is a view conceptually showing the reflection of a correction value corresponding to a lot and an offset on a substrate basis when a substrate loss has occurred.

FIG. 4 is a view conceptually showing the reflection of a correction value corresponding to each lot and an offset on a substrate basis in the exposure apparatus 10. As shown in FIG. 4, the exposure apparatus 10 performs an exposure process while reflecting a correction value on a lot basis and an offset on a substrate basis, in addition to a measurement result on alignment marks, with respect to each substrate. In this case, a correction value on a lot basis and an offset on a substrate basis include, for example, information used to align a substrate at the time of an exposure process. Referring to FIG. 4, there is a consistent relationship between an offset on a substrate basis and a processing target substrate. Note however that if a substrate loss is caused by an error in the coating/developing apparatus 20 and a defect (omission) of a substrate of a lot occurs, inconsistency (substrate shift) occurs in the relationship between an offset on a substrate basis and a processing target substrate, as shown in FIG. 5. In this case, if inconsistency occurs in the relationship between an offset on a substrate basis and a processing target substrate, the overlay accuracy deteriorates on the subsequent substrates, which eventually become rework targets.

Under the circumstance, the lithography system 1 according to this embodiment is configured to maintain overlay accuracy without causing any inconsistency in the relationship between an offset on a substrate basis and a processing target substrate even if a substrate loss has occurred in the coating/developing apparatus 20.

Figure 6:
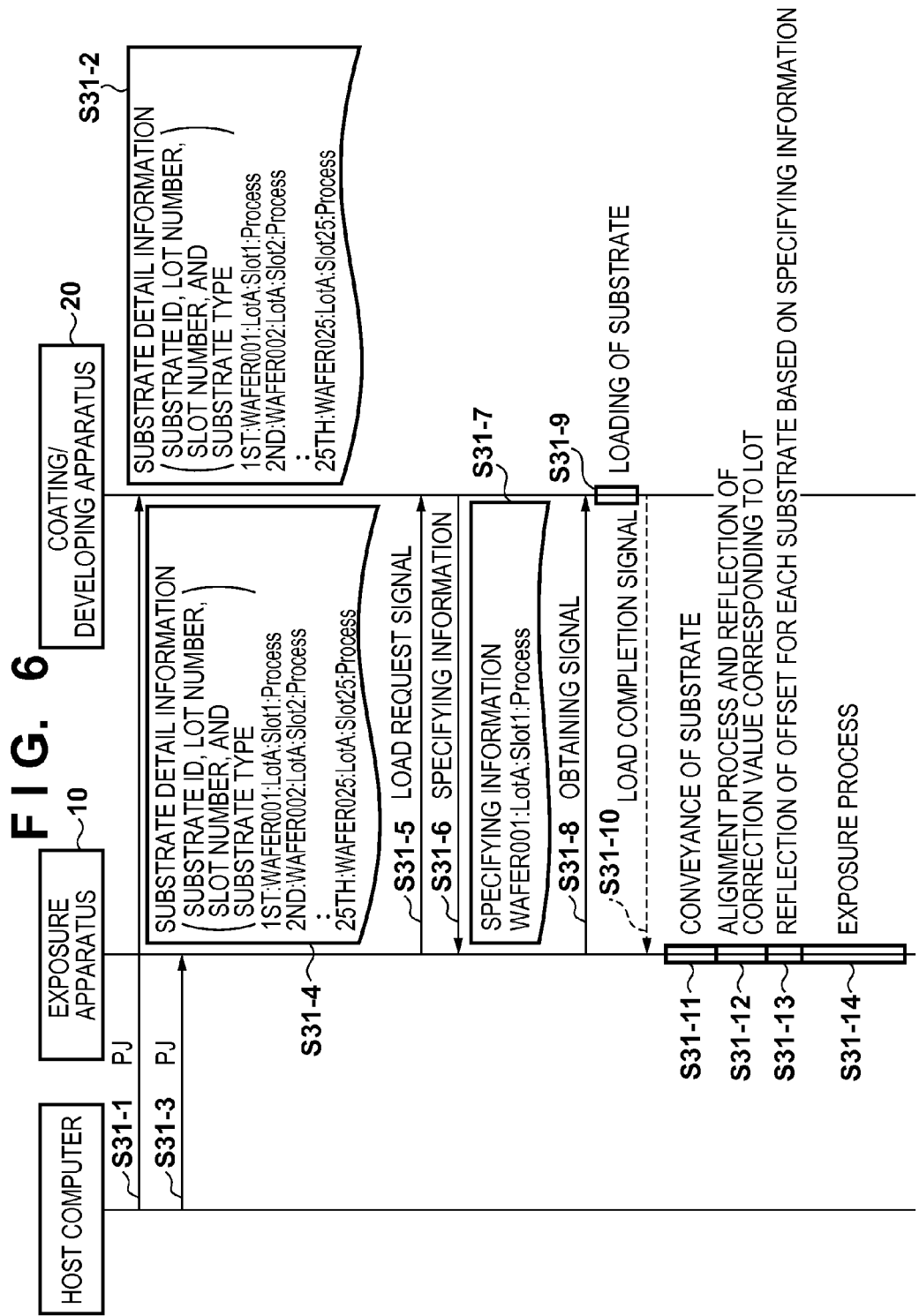
FIG. 6 is a sequence timing chart between an exposure apparatus, a coating/developing apparatus, and a host computer according to an embodiment.

The operation of the lithography system 1 according to this embodiment will be described with reference to FIG. 6. FIG. 6 is a sequence timing chart between the exposure apparatus 10, the coating/developing apparatus 20, and the host computer.

In step S31-1, the host computer transmits the process job PJ to the coating/developing apparatus 20. In step S31-2, the coating/developing apparatus 20 receives the process job PJ transmitted from the host computer. The process job PJ instructs to perform a process of forming a pattern on a substrate, and contains substrate detail information representing the details of a plurality of substrates to be subjected to this process. Upon receiving the process job PJ from the host computer, the coating/developing apparatus 20 starts a process of coating the substrate with a resist.

In addition, in step S31-3, the host computer transmits the process job PJ to the exposure apparatus 10. The process job PJ transmitted in step S31-3 is identical to the process job PJ transmitted in step S31-1. Upon receiving the process job PJ from the host computer, the exposure apparatus 10 starts an exposure process of exposing the substrate conveyed from the coating/developing apparatus 20.

In step S31-5, the exposure apparatus 10 transmits, to the coating/developing apparatus 20, a load request signal for requesting the loading of a substrate. In step S31-6, the coating/developing apparatus 20 transmits, to the exposure apparatus 10, specifying information (first specifying information) which specifies a substrate planned to be loaded into the exposure apparatus 10. Such specifying information is information for specifying a processing target substrate, of a plurality of substrates which have been coated with a resist by the coating/developing apparatus 20 and are to be subjected to an exposure process, which is conveyed from the coating/developing apparatus 20 to the exposure apparatus 10. More specifically, specifying information contains at least one of a substrate identifier (substrate ID) for identifying the substrate and a slot number indicating the slot in which the substrate has been accommodated. In this embodiment, specifying information includes a lot number and a substrate type in addition to the substrate ID and the slot number. As described above, the coating/developing apparatus 20 has the function of a notification unit which notifies the exposure apparatus 10 of specifying information which specifies a processing target substrate conveyed from the coating/developing apparatus 20 to the exposure apparatus 10. Such a notification unit may be implemented by a control unit which controls the overall coating/developing apparatus 20.

In step S31-7, the exposure apparatus 10 obtains the specifying information from the coating/developing apparatus 20. In step S31-8, the exposure apparatus 10 collates the substrate detail information obtained from the host computer in step S31-3 with the specifying information obtained from the coating/developing apparatus 20, and transmits, to the coating/developing apparatus 20, an obtaining signal which notifies that the specifying information has been obtained.

In step S31-9, the coating/developing apparatus 20 starts loading the substrate coated with the resist, more specifically, the substrate specified by the specifying information transmitted in step S31-6, into the exposure apparatus 10. In step S31-10, the coating/developing apparatus 20 transmits, to the exposure apparatus 10, a load completion signal which notifies the completion of the loading of the substrate into the exposure apparatus 10.

In step S31-11, the exposure apparatus 10 conveys the substrate loaded from the coating/developing apparatus 20, and loads the substrate into the exposure processing unit 100 (makes the substrate stage 121 holds the substrate). In step S31-12, the exposure apparatus 10 performs an alignment process on the substrate held by the substrate stage 121 and reflects a correction value corresponding to the lot (that is, on a lot basis).

In step S31-13, the exposure apparatus 10 reflects an offset (offset correction information) for each substrate (that is, on a substrate basis) obtained in advance from the initial lot based on the specifying information obtained in step S31-7. More specifically, the exposure apparatus 10 selects an offset corresponding to a processing target substrate from a plurality of offsets respectively corresponding to a plurality of substrates based on the substrate ID or slot number contained in the specifying information, and reflects the selected offset. The exposure apparatus 10 has obtained substrate detail information from the host computer with respect to all the substrates contained in the lot (step S31-4), and hence can select an offset corresponding to each of a plurality of substrates to be subjected to an exposure process.

In step S31-14, the exposure apparatus 10 performs an exposure process on the substrate while reflecting a correction value corresponding to the lot and an offset for each substrate.

Figure 7:
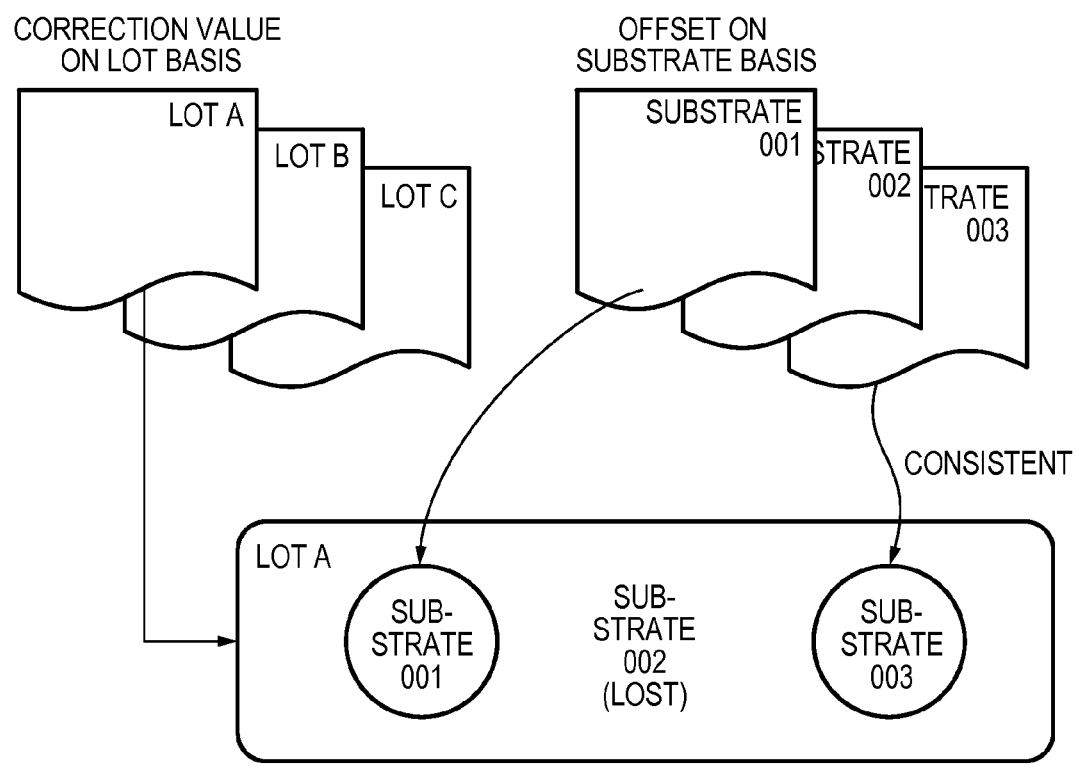
FIG. 7 is a view conceptually showing the reflection of a correction value corresponding to a lot and an offset on a substrate basis when a substrate loss has occurred according to this embodiment.

FIG. 7 is a view conceptually showing the reflection of a correction value corresponding to each lot and an offset on a substrate basis when a substrate loss has occurred in the coating/developing apparatus 20 in the lithography system 1 according to this embodiment. As described above, in this embodiment, since the exposure apparatus 10 obtains specifying information for specifying a processing target substrate from the coating/developing apparatus 20, it is possible to select an offset corresponding to the processing target substrate from a plurality of offsets respectively corresponding to a plurality of substrates. As shown in FIG. 7, therefore, even if a substrate loss occurs in the coating/developing apparatus 20, it is possible to establish a consistent relationship between an offset on a substrate basis and a processing target substrate without causing any inconsistency (substrate shift) in the relationship between an offset on a substrate basis and a processing target substrate.

As described above, according to this embodiment, it is possible to select an offset corresponding to a processing target substrate from a plurality of offsets respectively corresponding to a plurality of substrates based on specifying information which specifies the processing target substrate and to perform an exposure process on the processing target substrate by using the selected offset. Therefore, the lithography system 1 (exposure apparatus 10) can provide an article such as a highly economical, high-quality device at a high throughput while maintaining overlay accuracy even at the occurrence of a substrate loss. By using the lithography system 1 (exposure apparatus 10), this manufacturing method includes a step of forming a pattern on a substrate coated with a resist and a step of performing a process (for example, developing) on the substrate on which the pattern is formed. In addition, following the above forming steps, the manufacturing method includes other known steps (oxidation, film formation, deposition, doping, planarization, etching, resist removal, dicing, bonding, packaging, and the like). The method of manufacturing an article according to this embodiment is superior to the conventional method in at least one of the performance, quality, productivity, and production cost of an article.

In addition, in the lithography system 1, the exposure apparatus 10 can detect the occurrence of a substrate loss in the coating/developing apparatus 20 because the exposure apparatus 10 has obtained substrate detail information from the host computer. Substrate detail information from the host computer is information (second specifying information) which specifies each of a plurality of substrates contained in a lot. It is therefore possible to detect a substrate (substrate loss), of the plurality of substrates contained in a lot, which is not conveyed from the coating/developing apparatus 20 to the exposure apparatus 10, based on specifying information from the coating/developing apparatus 20 and substrate detail information from the host computer. Note that the function of a detection unit which detects such a substrate loss may be implemented by the control unit 130 including a communication port.

In addition, this embodiment has exemplified the case in which the exposure apparatus 10 selects an offset corresponding to a processing target substrate from a plurality of offsets respectively corresponding to a plurality of substrates based on specifying information which specifies the processing target substrate which is obtained from the coating/developing apparatus 20. However, as described above, the exposure apparatus 10 can also detect a substrate loss. Therefore, the exposure apparatus 10 can also select one offset corresponding to a processing target substrate from a plurality of offsets respectively corresponding to a plurality of substrates based on a substrate loss detection result so as to establish consistency between the processing target substrate and the offset.

The present invention is not limited to the exposure apparatus, and is also applicable to a lithography apparatus such as a drawing apparatus or imprint apparatus. Here, the drawing apparatus is a lithography apparatus that draws on a substrate with a charged particle beam (for example, an electron beam or ion beam). The imprint apparatus is a lithography apparatus that molds an imprint material (for example, a resin) on a substrate and forms a pattern on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-018832 filed Feb. 3, 2014, which is hereby incorporated by reference herein in its entirety.

What is claimed is:

1. A lithography apparatus which performs a process of forming a pattern on a substrate conveyed from a coating apparatus which coats the substrate with a resist, the lithography apparatus comprising:

an obtaining unit configured to obtain, from the coating apparatus, first specifying information which specifies a processing target substrate conveyed from the coating apparatus to the lithography apparatus, out of a plurality of substrates which are coated with the resist by the coating apparatus and on which the process is to be performed; and a processing unit configured to:

select offset correction information corresponding to the processing target substrate from a plurality of pieces of offset correction information respectively corresponding to the plurality of substrates based on the first specifying information, the offset correction information including an offset on a substrate basis for changing a correction value corresponding to a lot in which the processing target substrate belongs, to a correction value corresponding to the processing target substrate, and perform the process on the processing target substrate based on the correction value corresponding to the lot and the selected offset correction information.

2. The lithography apparatus according to claim 1, wherein the first specifying information includes at least one of a substrate identifier for identifying a substrate and a slot number indicating a slot in which the substrate has been accommodated.

3. The lithography apparatus according to claim 1, wherein the offset correction information includes information used to align a substrate when performing the process.

4. The lithography apparatus according to claim 1,
wherein the obtaining unit is configured to obtain second specifying information which specifies each of the plurality of substrates from a host computer connected to the lithography apparatus, and wherein the lithography apparatus further comprises a detection unit configured to detect non-conveyance of a substrate from the coating apparatus to the lithography apparatus, out of the plurality of substrates, based on the first specifying information and the second specifying information.

5. The lithography apparatus according to claim 4, wherein the processing unit is configured to select one piece of offset correction information from a plurality of pieces of offset correction information respectively corresponding to the plurality of substrates, based on a detection result obtained by the detection unit, so as to establish consistency between the processing target substrate and the selected offset correction information, and to perform the process based on the correction value corresponding to the lot and the selected offset correction information.

6. The lithography apparatus according to claim 4, wherein the detection unit is configured to detect the non-conveyance of the substrate by collating the second specifying information with the first specifying information.

7. The lithography apparatus according to claim 4, wherein the detection unit is configured to detect the non-conveyance of the substrate in a case where the non-conveyed substrate is lost in the coating apparatus.

8. The lithography apparatus according to claim 1, wherein the processing unit comprises a projection optical system configured to project an image corresponding to the pattern onto the processing target substrate.

9. A lithography apparatus which performs a process of forming a pattern on a substrate conveyed from a coating apparatus which coats the substrate with a resist, the lithography apparatus comprising:
an obtaining unit configured to obtain, from the coating apparatus, first specifying information which specifies a processing target substrate conveyed from the coating apparatus to the lithography apparatus, out of a plurality of substrates which are coated with a resist by the coating apparatus and on which the process is to be performed and to obtain, from a host computer connected to the lithography apparatus, second specifying information which specifies the plurality of substrates; and
a detection unit configured to detect non-conveyance of a substrate from the coating apparatus to the lithography apparatus, out of the plurality of substrates, based on the first specifying information and the second specifying information.

10. The lithography apparatus according to claim 9, further comprising a processing unit configured to select one piece of offset correction information from a plurality of pieces of offset correction information respectively corresponding to the plurality of substrates, based on a detection result obtained by the detection unit, so as to establish consistency between the processing target substrate and the selected offset correction information, and perform the process by using the selected offset correction information.

11. The lithography apparatus according to claim 10, wherein the processing unit comprises a projection optical system configured to project an image corresponding to the pattern onto the processing target substrate.

12. The lithography apparatus according to claim 9, wherein the detection unit is configured to detect the non-conveyance of the substrate by collating the second specifying information with the first specifying information.

13. The lithography apparatus according to claim 9, wherein the detection unit is configured to detect the non-conveyance of the substrate in a case where the non-conveyed substrate is lost in the coating apparatus.

14. A lithography system comprising a coating apparatus configured to coat a substrate with a resist and a lithography apparatus configured to perform a process of forming a pattern on a substrate conveyed from the coating apparatus,
the coating apparatus comprising a notification unit configured to notify the lithography apparatus of first specifying information which specifies a processing target substrate conveyed from the coating apparatus to the lithography apparatus, out of a plurality of substrates which are coated with a resist by the coating apparatus and on which the process is to be performed, and
the lithography apparatus comprising a processing unit configured to:
select offset correction information corresponding to the processing target substrate from a plurality of pieces of offset correction information respectively corresponding to the plurality of substrates based on the first specifying information notified by the notification unit, the offset correction information including an offset on a substrate basis for changing a correction value corresponding to a lot in which the processing target substrate belongs, to a correction value corresponding to the processing target substrate, and
perform the process on the processing target substrate based on the correction value corresponding to the lot and the selected offset correction information.

15. A method of manufacturing an article, the method comprising:
forming a pattern on a substrate using a lithography apparatus; and
processing the substrate on which the pattern has been formed,
wherein the lithography apparatus performs a process of forming the pattern on the substrate conveyed from a coating apparatus which coats the substrate with a resist, and includes:
an obtaining unit configured to obtain, from the coating apparatus, first specifying information which specifies a processing target substrate conveyed from the coating apparatus to the lithography apparatus, out of a plurality of substrates which are coated with the resist by the coating apparatus and on which the process is to be performed; and
a processing unit configured to:

select offset correction information corresponding to the processing target substrate from a plurality of pieces of offset correction information respectively corresponding to the plurality of substrates based on the first specifying information, the offset correction information including an offset on a substrate basis for changing a correction value corresponding to a lot in which the processing target substrate belongs, to a correction value corresponding to the processing target substrate, and perform the process on the processing target substrate based on the correction value corresponding to the lot and the selected offset correction information.

16. A method of manufacturing an article, the method comprising:

forming a pattern on a substrate using a lithography apparatus; and processing the substrate on which the pattern has been formed, wherein the lithography apparatus performs a process of forming the pattern on the substrate conveyed from a coating apparatus which coats the substrate with a resist, and includes:

an obtaining unit configured to obtain, from the coating apparatus, first specifying information which specifies a processing target substrate conveyed from the coating apparatus to the lithography apparatus, out of a plurality of substrates which are coated with a resist by the coating apparatus and on which the process is to be performed and to obtain, from a host computer connected to the lithography apparatus, second specifying information which specifies the plurality of substrates; and a detection unit configured to detect non-conveyance of a substrate from the coating apparatus to the lithography apparatus, out of the plurality of substrates, based on the first specifying information and the second specifying information.

17. A method of manufacturing an article, the method comprising:

forming a pattern on a substrate using a lithography system; and processing the substrate on which the pattern has been formed, wherein the lithography system includes a coating apparatus configured to coat the substrate with a resist and a lithography apparatus configured to perform a process of forming the pattern on the substrate conveyed from the coating apparatus, the coating apparatus includes a notification unit configured to notify the lithography apparatus of first specifying information which specifies a processing target substrate conveyed from the coating apparatus to the lithography apparatus, out of a plurality of substrates which are coated with a resist by the coating apparatus and on which the process is to be performed, and the lithography apparatus includes a processing unit configured to:

select offset correction information corresponding to the processing target substrate from a plurality of pieces of offset correction information respectively corresponding to the plurality of substrates based on the first specifying information notified by the notification unit, the offset correction information including an offset on a substrate basis for changing a correction value corresponding to a lot in which the processing target substrate belongs, to a correction value corresponding to the processing target substrate, and perform the process on the processing target substrate based on the correction value corresponding to the lot and the selected offset correction information.

* * * * *